United States Patent [19]
Lee et al.

[11] Patent Number: 6,132,091
[45] Date of Patent: Oct. 17, 2000

[54] X-Y STAGE WITH ARCUATE SURFACE BEARINGS

[75] Inventors: Martin E. Lee, Saratoga; Michael R. Sogard, Menlo Park, both of Calif.

[73] Assignee: Nikon Corporation, Tokyo, Japan

[21] Appl. No.: 09/193,915

[22] Filed: Nov. 17, 1998

[51] Int. Cl.[7] .................................................. F16C 29/00
[52] U.S. Cl. .................... 384/9; 74/490.09; 108/137; 248/913; 384/2; 384/7; 384/36
[58] Field of Search .................... 384/2–6, 7, 9, 384/36, 56, 590, 618; 74/490.08, 490.09, 490.13; 248/913; 108/137, 102, 20, 143

[56] References Cited

U.S. PATENT DOCUMENTS

| | | | |
|---|---|---|---|
| 4,438,983 | 3/1984 | Davis | 384/2 |
| 5,152,488 | 10/1992 | Richardson | 248/913 X |
| 5,366,297 | 11/1994 | Wolverton et al. | 384/9 |
| 5,466,068 | 11/1995 | Andra et al. | 384/36 |

*Primary Examiner*—Thomas R. Hannon
*Attorney, Agent, or Firm*—Skjerven, Morrill, MacPherson, Franklin & Friel LLP; Norman R. Klivans

[57] ABSTRACT

A two-axis stage assembly includes a generally planar horizontally mounted base plate; a stage plate generally parallel to the base plate, the stage plate having a first axis and second orthogonal axis; a set of spaced bearings depending from a bottom surface of said stage plate, the bearings each having an arcuate bottom surface in rocking contact with a facing support surface of the base plate; a joint attached to the bottom surface of the stage plate and pivotably mounting each bearing, the joint being positioned at the center of curvature of the arcuate bottom surface of the associated bearing; and where an axial movement of the stage plate rocks the bearing arcuate bottom surfaces with respect to the facing support surface of the base plate.

14 Claims, 3 Drawing Sheets

X-Y STAGE WITH ARCUATE SURFACE BEARINGS

FIELD OF THE INVENTION

This invention relates to precision motion devices and more particularly to an X-Y stage.

BACKGROUND

X-Y stages are well known; they are typically used in machine tools and other applications where two dimensional precise movement is needed to position an object supported on the stage. An application of X-Y stages is in lithography equipment e.g. for semiconductor wafer processing. In this case, a stage is typically used in a lithography tool to position, in two dimensions, the reticle (mask). A separate stage is sometimes provided to position the semiconductor wafer or other workpiece. Mechanical and thermal disturbances are problematic since they reduce the resolution, positioning accuracy and useful positioning speed of the stage and the lithography process. Hence there is a need for improved stages. Increasingly there is also a need for stages which can operate in a vacuum, e.g. for use in electron beam lithography.

SUMMARY

In accordance with this invention, a novel bearing system supports the weight of an X-Y stage on an underlying support surface (the "Z base plate"). It is to be understood that the X-Y stage may be relatively large and heavy. Conventionally such stages are supported on a base e.g. by air bearings or mechanical bearings. In accordance with the invention, a special kind of arcuate bearing is used in which the bearings each have an arcuate (e.g. spherical or cylindrical) distal surface which bears on a generally flat facing surface of the base plate. In one embodiment only three or four such bearings support the entire stage assembly.

These arcuate surfaces and bearings are not continuously constrained in a cage, unlike a conventional ball bearing, but instead each moves freely relative to the stage around a joint (coupling) mounted at the center of curvature of the spherical or cylindrical distal surface, and the underlying facing support surface of the generally planar horizontally mounted base plate. Therefore the associated bearing joint mountings on the x-y stage plate may encompass a small area. Further, the bearings of this invention eliminate the hoses, pumps and any scavenging baffles required to protect for instance an electron beam high vacuum environment (e.g. $10^{-7}$ Torr) from air leakage caused by a pressurized air bearing support. Moreover these bearings are likely to have less mechanical vibration associated with them than conventional ball bearings. Moreover, they will likely require little or no lubrication, thereby eliminating another potential problem in vacuum applications.

A two-axis stage according to the invention includes a generally planar horizontally mounted base plate; a stage plate generally parallel to the base plate, the stage plate having a first axis and a second orthogonal axis in the plane of the plate; and a series of spaced bearings depending from a bottom surface of said stage plate, the bearings each having an arcuate bottom surface in rocking contact with a facing support surface of the base plate. A joint (coupling) is attached to the bottom surface of the stage plate which pivotally mounts each bearing such that movement of the stage plate rotates the bearing arcuate distal surfaces with respect to the facing support surface of the base plate. The coupling is positioned at the center of curvature of the arcuate bottom surface. The arcuate bottom surfaces are e.g. a segment of a sphere or a segment of a cylinder. In the cylindrical case, two such surfaces are "stacked" to allow two dimensional movement.

DETAILED DESCRIPTION

The following description is directed to a stage in accordance with this invention which (in the disclosed embodiment) is adapted for use with a stage assembly of an electron beam lithography tool in order to hold a reticle or wafer for positioning therein. The remainder of the tool is not shown as being conventional. However the present invention is not limited to this particular application, as will be understood by one of ordinary skill in the art, and certain features of the disclosed apparatus therefore may be modified as suitable for other applications.

Figure 1:
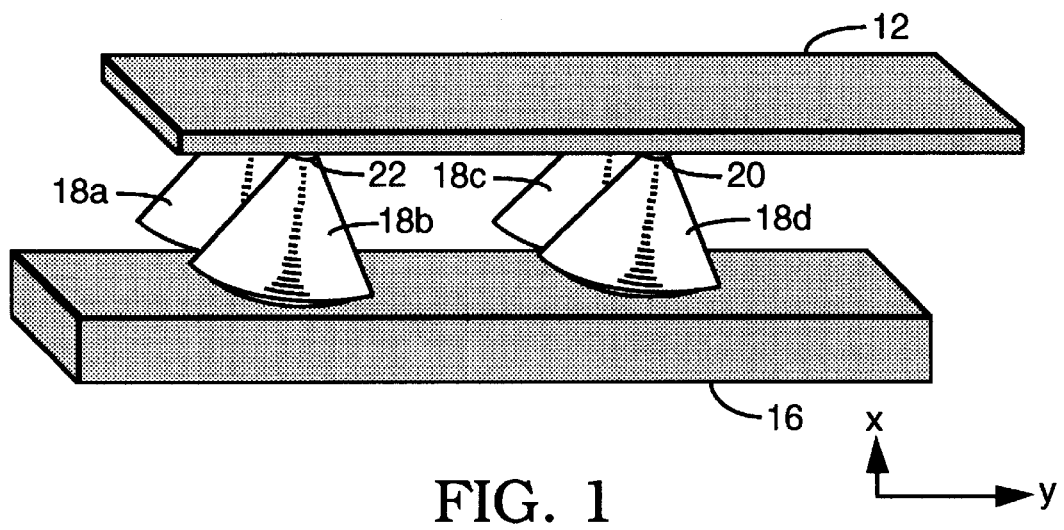
FIG. 1 is a perspective view of the stage assembly in accordance with a spherical embodiment of the invention.

FIG. 1 shows a perspective view of a stage assembly in accordance with this invention; this and the other drawings are not to any particular scale. The stage plate 12 is shown in simplified form. The stage plate 12 is supported on the base plate 16. The materials, dimensions, etc. of the stage and base plate are adapted to the particular application. Both are typically rigid structures. In the electron beam lithography context, the stage plate 12 may hold for instance a reticle (mask) or a workpiece (wafer). In one embodiment, the stage is similar to that of U.S. patent application Ser. No. 09/287,545 filed Apr. 6, 1999 entitled X-Y Stage with Movable Magnet Plate, inventor Martin E. Lee, Docket No. M-4778 US, incorporated herein by reference in its entirety. The base plate 16 is supported on a foundation or support structure which may rest on the ground.

The entire mass of the stage plate 12 (the stage itself may in fact be a complex structure, including a number of other elements including positioning motors, not shown) is supported on the base plate 16 by four individual bearings in this embodiment. Of course, more or fewer bearings may be used in other applications. These bearings are generally shown at 18a, 18b, 18c and 18d. Each of these bearings is essentially identical and they are spaced apart so as to properly support the stage 12.

The lower (distal) portion of each bearing is an arcuate (curved) surface. In this embodiment, the arcuate surface is a section of a sphere. The actual radius and amount of the spherical section used is dependent upon the separation between the stage plate 12 and base plate 16, and the amount of movement needed of stage plate 12 relative to base plate 16 respectively. The arcuate surface of each of the bearings which bears on the base plate 16 is typically hardened or formed of some hard material, e.g. silicon nitride or silicon carbide. Each of these arcuate surfaces bears on an appropriate hardened or hard portion of base plate 16, for instance again silicon nitride or silicon carbide or some other hard material. Of course, a wide choice of materials is possible. Both of these materials are insulators. Electrical conductive or magnetically permeable materials may not be acceptable for an electron beam lithography application.

The upper portion of each of the bearings is coupled by a joint (coupling) to the under surface of stage plate 12. At least a small portion of each coupling associated with bearings 18b and 18d is shown respectively at 22 and 20. The nature of these couplings is such as to allow appropriate x-y plane motion of stage plate 12 relative to base plate 16.

For instance, this coupling may be a universal joint employing ball bearings, or a flexure. A universal joint (U-joint) is a well known structure which includes a shaft coupling traditionally capable of transmitting rotation from a shaft to another shaft not co-linear with it, and typically consisting of a cross-shaped piece having pivots on its arms so arranged that each pair of pivots engage with the eyes of a yoke on the end of one shaft. A flexure is a springy e.g. metal structure which allows motion with limited degrees of freedom, for instance a leaf spring type structure. In this case a flexure formed from a block of metal and defining slots extending in two perpendicular directions thereby allowing flexing of the remaining material would allow the required two dimensional movement. Other types of couplings are suitable as will be understood from the following description.

Stage plate 12 moves both in the x axis direction and the y axis direction with respect to the base plate 16 and at a constant distance from it; the amount of travel is application dependent. The radius of curvature of the arcuate surface R and the angle θ through which the bearing rotates are related to the stage travel S through the geometric relation $$S = R\theta$$

The angle θ is limited, because at an extreme of travel, an edge of the bearing structure must not contact the underside of the stage plate 12; the coupling of the bearing to the stage plate may further limit the angular range. It is easy to see that this implies an upper limit to θ of π/2. Thus a convenient way to represent the angle θ is by the relation θ=fπ/2, where f<1 and is determined by the detailed properties of the bearing and coupling. As an example, if the desired stage travel is S=400 mm, and f=0.8, then the required radius of curvature must be at least 318 mm. This then represents the minimum spacing between the stage plate 12 and the base plate 16.

The combination of the arcuate surface on the distal portion of each bearing and the associated coupling at the other end of each bearing allows this movement, so thereby no air bearings or other fluid bearings are necessary. Hence, these arcuate bearings are specially suitable for use in a vacuum. Also, due to the nature of these bearings, they require little or no lubrication. The distal spherical surfaces generally require no lubrication, and a properly designed universal joint requires very little, if any, lubrication. Flexures, by their nature, are generally not lubricated. The absence of lubricants is advantageous, especially in the vacuum environment.

Fabrication of the bearings is conventional; each bearing is e.g. machined or cast from a single block of material or alternatively the arcuate surface is machined or cast and then fastened to the upper part of the bearing. Other fabrication techniques may also be used.

Figure 2:
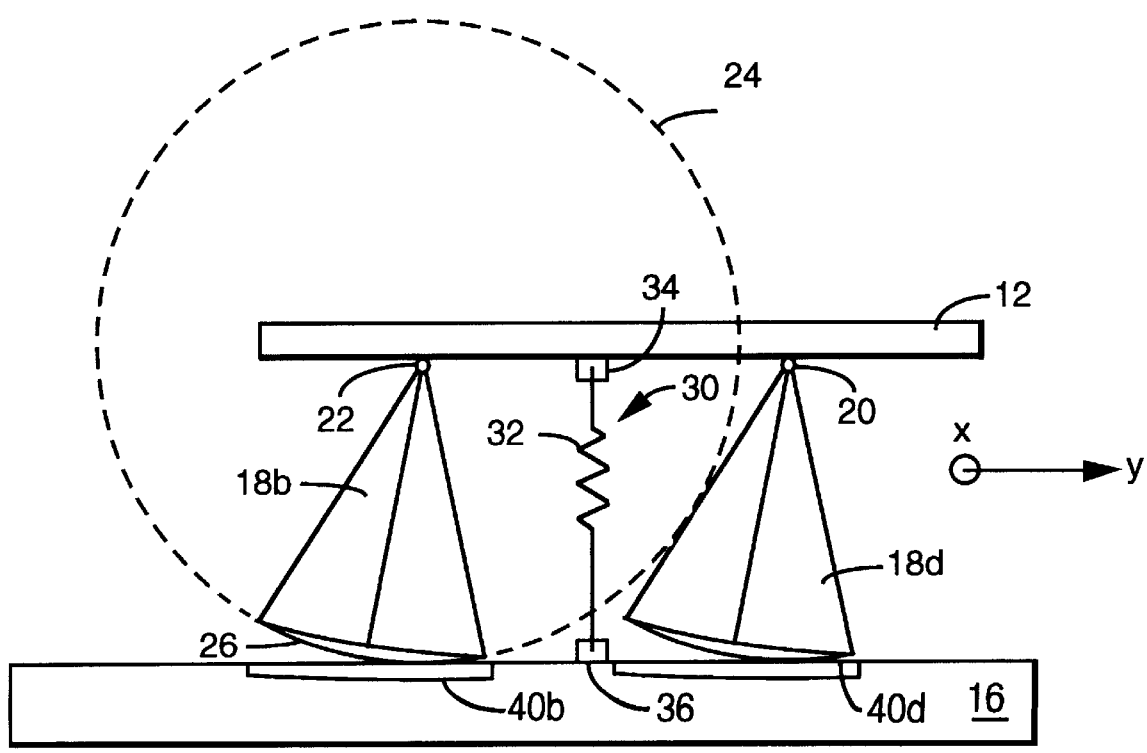
FIG. 2 is a side view showing the stage assembly of FIG. 1.

FIG. 2 shows a side view of the FIG. 1 structure showing only the two visible bearings 18b and 18d, the others being hidden from view. Dotted line 24 is not a structural element, but illustrates the spherical surface of which the actual bearing surface 26 of bearing 18b is a section. The configuration of the upper portion of bearing 18b (to which the coupling is attached) is not critical.

Preload structure 30 includes a spring 32 coupled at its ends, respectively 34 and 36, to the stage plate 12 and the base plate 16. Spring 32 draws the stage plate down towards the base plate, that is pulls it towards the base plate, and thereby ensures good contact between the bearing surface 26 of bearing 18b and the similar surface of bearing 18d and the associated bearing support areas on the base plate 16. Instead of a spring, another way to apply such preload force is to apply a downwards pressure on stage plate 12, for instance, by pushing down on it with a mass. In other applications, no such preload is needed if the stage plate itself 12 is heavy enough. Multiple such preload structures 30 may be used; in one embodiment, one such preload structure is associated with each individual bearing. The joints 20 and 22 are not shown in any detail since their internal structure is conventional, as described above.

It is to be understood that the spherical surface 26 rocks over the base plate 16 the same distance as the stage 12 moves in the X-Y plane relative to the base plate 16. Thus the present bearing provides substantial axial (X-Y) travel of the stage with a minimum movement of the spherical surface bearing itself. In this case, the bearing pads 40b and 40d for spherical bearings 18b and 18d are illustrated. There is no requirement to have bearing pads; instead, the entire upper surface of the support plate 16 can be the bearing pad surface.

As illustrated in FIG. 2, the bearings 18b, 18d are generally unconstrained, unlike a conventional ball bearing which has a cage. Conventional bearings typically have several bearing members, such as balls or rollers, and their relative positions must be maintained within certain limits, for proper bearing operation. Caging can refer both to a physical retainer which prevents the bearing members' unrestrained relative motion, and to a procedure for establishing the desired relative positions initially. In the present embodiment a simple ring could be mounted on the base plate 16, surrounding each bearing, to prevent unrestrained lateral motion of the bearing.

With regard to initially establishing the proper bearing location, the following procedure could be used. First, a stage lift would be provided which could lift stage plate 12 just enough so that all the supporting bearings would be free to swing, like pendulums. Second, the stage would be moved to the position where all the bearings are designed to be vertical to the plates 12 and 16. Third, the stage lift would raise plate 12 for half of the time required for a bearing to swing its full swing and then it would lower the plate. This procedure is operative for any small angle, because it always takes the same amount of time, or period, for a pendulum to swing from side to side no matter what the small angle of swing is. If one frees the bearings to swing and then at half the period, lowers plate 12 all the bearings will be at half their swing or vertical when they contacted plate 16. This cages the bearings.

Figure 3A:
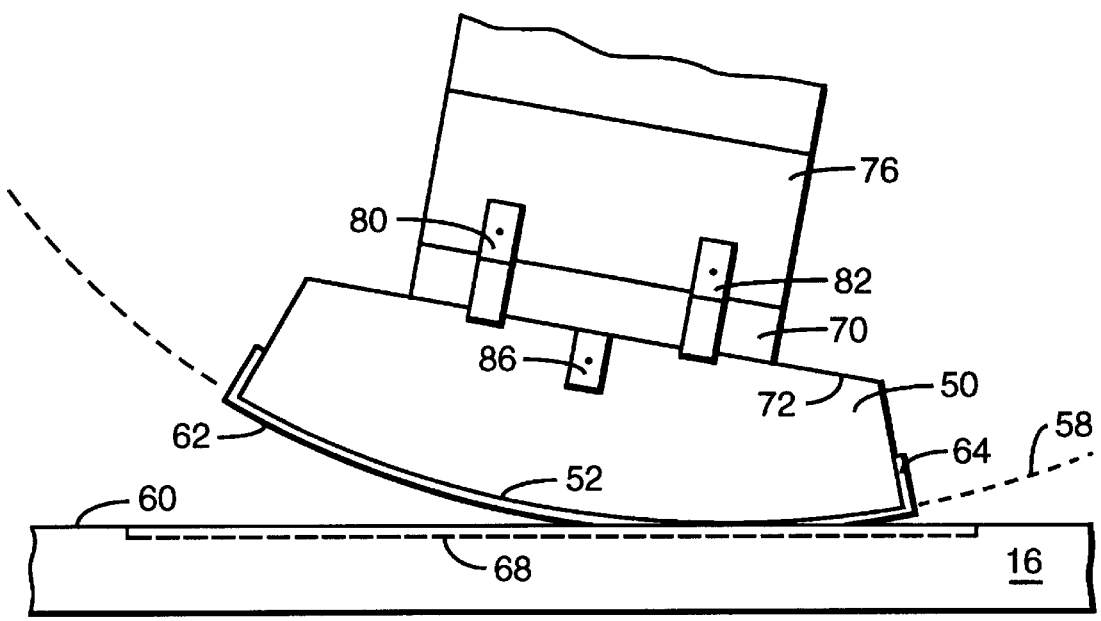
FIGS. 3A and 3B are views of the stage assembly in a first cylindrical embodiment.

FIG. 3A shows a side view of a second embodiment of a single bearing in accordance with this invention. (In an actual system, three or four bearings of the type in FIG. 3A would be used, as in FIG. 1.) Unlike the bearing of FIG. 2 where the bearing surface 26 is a section of a sphere, here the bearing arcuate surface is a section of a cylinder. (Elements shown in FIG. 3 similar to those in FIG. 2 are similarly labeled.) In FIG. 3A, the bearing structure 50 terminates in a bearing surface 52 which bears on the corresponding upper surface of support plate 16.

Since FIG. 3A is a side view, it shows the cylindrical surface 52 end-on and hence in this view, surface 52 resembles the spherical surface 26 of FIG. 2. The cylindrical surface 52 is a section therefore of cylinder 58 shown in dotted line. Similarly to the FIG. 2 structure, a suitable joint (not shown) is provided coupling the upper portion of the bearing to the lower surface of the stage 12 (not shown). Again, a preload structure may be provided.

Note that FIG. 3A does not show the upper portion of the bearing since this is similar to that shown in the previous figures. For the cylindrical bearing surface 52, the associated bearing structure 50 is attached to the surface 60 (which is the upper surface of the support plate 16). This attachment is by a set of bands of e.g. thin flexible metal or plastic. Two of these bands 62 and 64 are shown. A third band 66 is hidden behind band 62. It is to be understood that in this case bands 62 and 64 are displaced with regard to one another relative to the plane of the figure. The bands 62, 64 are located in respective recesses defined in surface 60; one such recess 68 is shown. Thereby the actual surface 52 of the bearing bears against surface 60 without the bands interfering therebetween.

The bands 62, 64 and 66 in effect cage the bearing structure 50 to the support plate 16 to prevent lateral displacement therebetween. That is, it is important that the bearing 50 not "walk" with respect to plate 16. (The first embodiment of FIGS. 1 and 2 is not so constrained.) The bands also prevent any rotation of bearing 50 relative to plate 16, thereby avoiding grinding off any particles from the bearing surfaces. The bands 62, 64 and 66 are each attached at one end to bearing structure 50 and at the other end to surface 60, for instance by screws.

It is to be understood that a cylindrical bearing surface 52 as shown in FIG. 3A only allows rocking movement in one direction, unlike the spherical bearing surface in FIG. 2. Hence in order to achieve two dimensional motion, a second similar cylindrical surface is provided which is "stacked" on top of bearing 50. This second cylindrical surface 70 is oriented at right angles to surface 52 with respect to the axes of the cylinders. Hence in FIG. 3A this surface 70 appears to be flat, because it is shown in a front view. The flat (planar) upper surface 72 of bearing structure 50 defines support surface on which cylindrical bearing surface 70 rocks back and forth along its axis perpendicular to the plane of the drawing.

The second cylindrical surface 70 is the bottom surface of a second bearing structure 76, the upper portion of which connects to the coupling which attaches to the underside of the stage plate (not shown). Hence this is a stacked bearing structure with two cylindrical surfaces arranged vertically and oriented at right angles to each other. It is to be understood that in order for this stacked structure to be operative, the longitudinal axes of the two cylindrical surfaces 52 and 70 must be perpendicular to one another and the two cylindrical surfaces also share a common central point at which the coupling is located. Thus they have different radii of curvature. The upper bearing structures 76 is attached by flexible bands to the associated support surface 72; these bands are shown respectively at 80, 82, and 86. In this case bands 80 and 82 are shown attached by screws to the upper bearing structure 76 at one end and extend along recesses defined in the supporting surface 72. The end of a third band 86 is also shown, the other end of which attaches to upper bearing structure 76. Thus upper bearing structure 76 is tied to the lower bearing structure 50 by flexible bands 80, 82, 86.

Figure 3B:
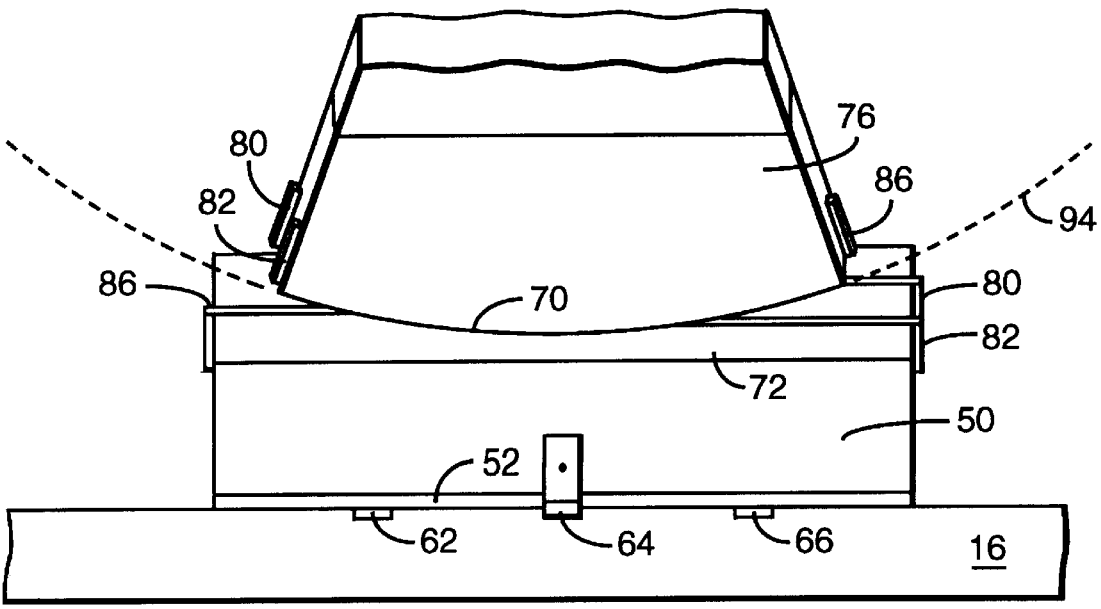

The structure of FIG. 3A is shown in a front view in FIG. 3B, that is rotated 90°. In this view, the cylindrical surface 52 appears to be flat. Other elements shown in FIG. 3B are the same as those illustrated in FIG. 3A. FIG. 3B also shows certain elements not visible in FIG. 3A including the radius of curvature 94 of upper bearing surface 70 which in this view appears curved. The other end of band 86 is also visible in FIG. 3B attached to the upper bearing structure 76. Visible in the lower portion of FIG. 3B are the other ends of bands 62, 64 and 66 recessed into surface 60.

Figure 4A:
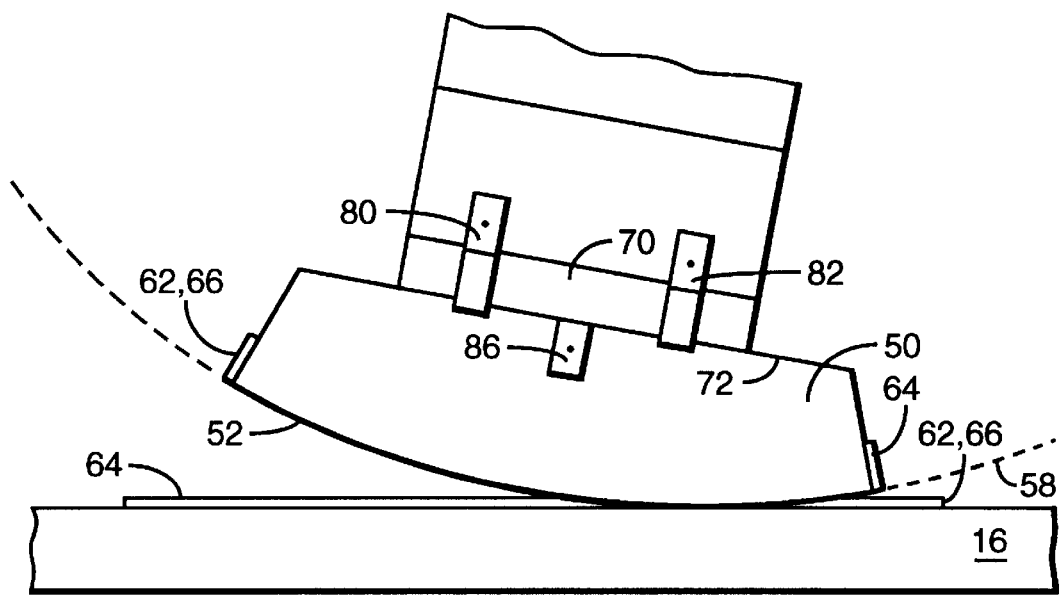
FIGS. 4A, 4B are views of a second cylindrical embodiment.
Figure 4B:
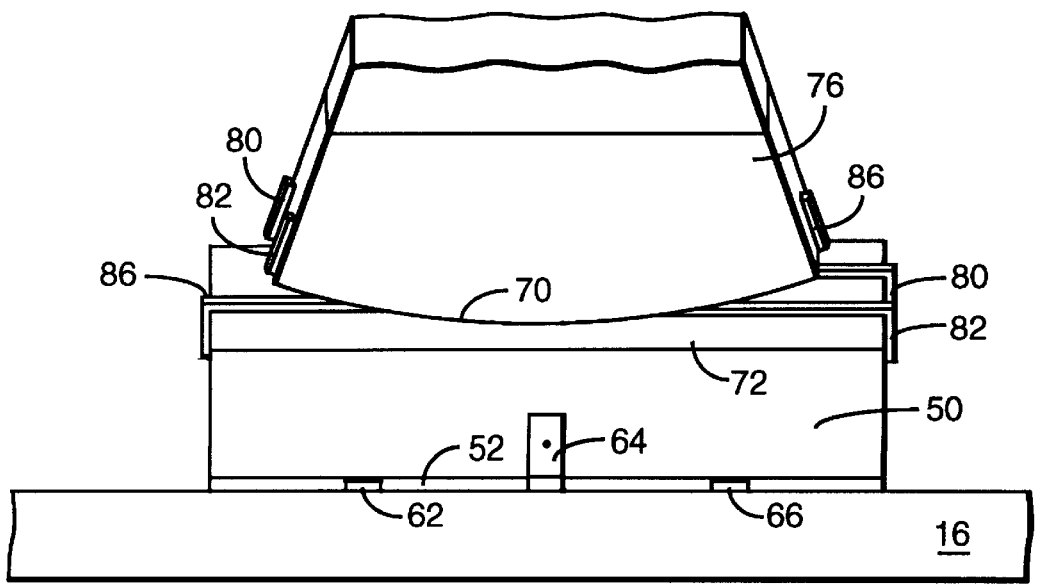

FIGS. 4A and 4B show a variation of the structure of FIGS. 3A and 3B, where the variation is that the bands rather than being recessed into depressions or slots defined in the planar bearing support surfaces of the bearings, are instead located in slots recessed into the cylindrical bearing surfaces. Hence FIG. 4A corresponds to FIG. 3A and FIG. 4B corresponds to FIG. 3B with this sole variation. Otherwise elements common to these two figures have similar reference numbers for ease of understanding, although it is to be appreciated they do depict different structures in terms of the recesses which accommodate the bands. In other embodiments, the bands are not located in recesses but instead are located between the bearing surfaces.

The cylindrical bearing surfaces of FIGS. 3A, 3B and 4A, 4B are believed to reduce the pressure on the bearing surface of plate 16 compared to the spherical bearing surface. Also, the cylindrical configuration allows the bearing to average out local deviations from flatness in the bearing surface more effectively than does the spherical surface of FIG. 2. The bands used in the cylindrical embodiment also prevent the arcuate bearing surfaces from rotating on the support surfaces, which undesirably may grind off matter from the bearing surfaces.

The second embodiment could also be operated upside down, i.e. with plate 16 now above plate 12 and the plate 12 below the bearing and serving as a mounting surface for the bearing joints 20, 22. Because the first embodiment has no caging, operating it upside down could lead to an unstable situation if the bearings walk.

With appropriate preloading the second embodiment could also be operated with the stage plate and base plate vertical.

Thereby advantageously in accordance with this invention, one achieves nearly frictionless bearing operation with little or no vibration and no lubrication. Also, no caging is required, at least in some embodiments.

This disclosure is illustrative and not limiting; further modifications will be apparent to one skilled in the art in light of this disclosure and are intended to fall within the scope of the appended claims.

We claim:

1. A two-axis stage assembly comprising:
   a generally planar horizontally mounted base plate;
   a stage plate generally parallel to the base plate, said stage plate defining a first axis and a second orthogonal axis;
   a plurality of spaced bearings depending from a bottom surface of said stage plate, said bearings each having an arcuate bottom surface in rocking contact with a facing support surface of the base plate;
   a coupling attached to the bottom surface of the stage plate and pivotably mounting such bearings, said coupling being positioned at the center of curvature of said arcuate bottom surface; and
   wherein an axial movement of said stage plate rocks the bearing arcuate bottom surface with respect to the facing support surface of the base plate.

2. The stage assembly of claim 1 wherein said coupling is a universal joint.

3. The stage assembly of claim 1 in which said coupling is a flexure.

4. The stage assembly of claim 1 wherein the arcuate bottom surface is spherical.

5. The stage assembly of claim 1 wherein the arcuate bottom surface is cylindrical.

6. The stage assembly of claim 5 each bearing further comprising a second arcuate bottom surface in rocking contact with an upper planar portion of the bearing.

7. The stage assembly of claim 1 wherein said bearings are spaced longitudinally and laterally from said stage plate.

8. The stage assembly of claim 1 wherein the facing support surface bears the weight of said stage plate, and there are at least three bearings, each bearing on the stage plate and on the facing support surface allowing said stage plate to move in first and second directions relative to the facing support surface.

9. The stage assembly of claim 1, wherein the bearings have a silicon nitride or silicon carbide distal surface and bear on silicon nitride or silicon carbide surfaces on the facing support surface.

10. The stage assembly of claim 1, further comprising a preload structure coupled to said stage plate and urging said stage plate towards said base plate.

11. The stage assembly of claim 10, said preload structure including a spring coupled between said base plate and said stage plate.

12. The stage assembly of claim 1, further comprising a mechanism for positioning the bearings relative to said stage plate and facing support surface.

13. The stage assembly of claim 12, wherein the mechanism includes at least one flexible band coupled between the facing support surface and the bearing.

14. The stage assembly of claim 13, wherein the band lies in a recess defined in one of the facing support surface or the arcuate bottom surface.

* * * * *